United States Patent
Ooi et al.

(10) Patent No.: US 9,755,403 B2
(45) Date of Patent: Sep. 5, 2017

(54) CONTROLLING THE EMISSION WAVELENGTH IN GROUP III-V SEMICONDUCTOR LASER DIODES

(71) Applicant: KING ABDULLAH UNIVERSITY OF SCIENCE AND TECHNOLOGY, Thuwal (SA)

(72) Inventors: Boon Siew Ooi, Thuwal (SA); Abdul Majid Mohammed, Thuwal (SA); Rami Afandy, Thuwal (SA); Ahmad Aljabr, Thuwal (SA)

(73) Assignee: KING ABDULLAH UNIVERSITY OF SCIENCE AND TECHNOLOGY, Thuwal (SA)

( * ) Notice: Subject to any disclaimer, the term of this patent is extended or adjusted under 35 U.S.C. 154(b) by 0 days.

(21) Appl. No.: 15/191,826

(22) Filed: Jun. 24, 2016

(65) Prior Publication Data

US 2016/0380409 A1 Dec. 29, 2016

Related U.S. Application Data

(60) Provisional application No. 62/184,111, filed on Jun. 24, 2015.

(51) Int. Cl.
  *H01S 5/34* (2006.01)
  *H01S 5/343* (2006.01)
  *H01S 5/32* (2006.01)

(52) U.S. Cl.
  CPC ............ *H01S 5/343* (2013.01); *H01S 5/3201* (2013.01); *H01S 5/34326* (2013.01); *H01S 5/34333* (2013.01); *H01S 2304/04* (2013.01)

(58) Field of Classification Search
  CPC .... H01S 5/343; H01S 5/3407; H01S 5/34326; H01S 5/34333; H01S 2304/02; H01S 2304/04; H01L 33/005; H01L 33/0062; H01L 33/0075; H01L 33/44
  See application file for complete search history.

(56) References Cited

U.S. PATENT DOCUMENTS

| | | | | |
|---|---|---|---|---|
| 5,351,258 | A * | 9/1994 | Okumura | B82Y 20/00 372/45.01 |
| 5,956,359 | A * | 9/1999 | Adams | B82Y 20/00 372/45.01 |
| 6,516,016 | B1 * | 2/2003 | Fukunaga | H01S 5/2231 372/45.01 |

(Continued)

*Primary Examiner* — Scott B Geyer
(74) *Attorney, Agent, or Firm* — Thomas | Horstemeyer, LLP

(57) ABSTRACT

Methods are provided for modifying the emission wavelength of a semiconductor quantum well laser diode, e.g. by blue shifting the emission wavelength. The methods can be applied to a variety of semiconductor quantum well laser diodes, e.g. group III-V semiconductor quantum wells. The group III-V semiconductor can include AlSb, AlAs, AlN, AlP, BN, GaSb, GaAs, GaN, GaP, InSb, InAs, InN, and InP, and group III-V ternary semiconductors alloys such as $Al_xGa_{1-x}As$. The methods can results in a blue shifting of about 20 meV to 350 meV, which can be used for example to make group III-V semiconductor quantum well laser diodes with an emission that is orange or yellow. Methods of making semiconductor quantum well laser diodes and semiconductor quantum well laser diodes made therefrom are also provided.

20 Claims, 7 Drawing Sheets

(56) References Cited

U.S. PATENT DOCUMENTS

| | | | | |
|---|---|---|---|---|
| 6,636,539 B2* | 10/2003 | Martinsen | ........... | H01S 5/02461 |
| | | | | 372/36 |
| 2002/0015428 A1* | 2/2002 | Fukunaga | ............... | H01S 5/164 |
| | | | | 372/46.01 |
| 2003/0179795 A1* | 9/2003 | Moriya | ................. | B82Y 20/00 |
| | | | | 372/46.01 |
| 2005/0127383 A1* | 6/2005 | Kikawa | ................ | H01S 5/0282 |
| | | | | 257/98 |
| 2008/0063020 A1* | 3/2008 | Fukuda | ............... | H01S 5/32341 |
| | | | | 372/45.012 |
| 2009/0045437 A1* | 2/2009 | Sandhu | ............. | H01L 21/02392 |
| | | | | 257/190 |

* cited by examiner peak emission of as-grown and dielectric induced emission from quantum well Simulated volumetric strain versus the thickness of dielectric.

CONTROLLING THE EMISSION WAVELENGTH IN GROUP III-V SEMICONDUCTOR LASER DIODES

CROSS-REFERENCE TO RELATED APPLICATIONS

This application claims priority to, and the benefit of, U.S. provisional application entitled "CONTROLLING THE EMISSION WAVELENGTH IN GROUP III-V SEMICONDUCTOR LASER DIODES" having Ser. No. 62/184,111, filed Jun. 24, 2015, the contents of which are incorporated by reference in their entirety.

BACKGROUND

The growth of semiconductor III-V compounds by chemical vapor deposition (CVD), for example using organometallics and hydrides as elemental sources, has developed into a viable process with many potential commercial applications and has enabled significant control over the fabrication process. Group III-V semiconductor lasers have an important technological role (e.g., in optical fiber communications, medical equipment, CD players), and further growth of the use of such lasers can be confidently anticipated. One well-known compound semiconductor system is the (Al,Ga,In)P system. A compound belonging to the (Al,Ga,In)P system can have, for example, the general formula $(Al_xGa_{1-x})_{1-y}In_yP$, where both x and y are between 0 and 1. Another well-known structures is the (Ga,In)N system. A compound belonging to the (Ga,In)N system can have, for example, the general formula $Ga_{1-y}In_yN$, where y is between 0 and 1.

Semiconductor visible laser diodes (LDs) cover a wide spectrum of wavelengths. For example, the InGaN/GaN based LDs cover the violet to green spectrum (~405-530 nm), and InGaP/InAlGaP system based LDs cover the red spectrum (635-690 nm). The wavelength from ~530-635nm is not covered by any commercial LDs yet, which has some important applications in solid-state lighting, medicine, horticulture, displays, visible light communications (VLC) and in optical communication using plastic fibers. LDs in the green-yellow-orange range (530-635 nm) can be ideally grown either by InGaN/GaN or InGaP/InAlGaP based material system. For the InGaN/GaN quantum well (QW) structure, large strain and indium segregation prevent the growth of high quality light emitting devices in yellow and orange spectrum region. In the case of InGaP/InAlGaP system, small band offset between the quantum-well and barriers leads small carrier confinement and large carrier leakage prohibit the growth of high quality QW structures for yellow and orange emissions.

The only access to orange, yellow and green region has been achieved by frequency doubling of diode-pumped solid state lasers or infrared laser diodes or through the application of high external pressures which causes large blue-shifts of the emission wavelength of diode lasers. However, the frequency doubled diode-pumped semiconductor lasers uses non-linear crystal for inefficient second-harmonic generation and requires external distributed Bragg reflector and good heat sink which makes the overall system more complex. Though InGaN based vertical-external-cavity surface-emitting lasers which are also known as optically pumped semiconductor lasers are worthy contender for wavelength tuning, high optical output power and a nearly diffraction limited beam quality but electrical pumping in these devices are challenging. Also, the lasers produced by application of external pressure technique are non-practical for any commercial applications. Therefore, there is huge demand for replacements of these complex, expensive and power consuming lasers.

It is therefore an object of this disclosure to provide improved semiconductor laser diodes and methods of making and using such laser diodes with improved control over the emission wavelength.

SUMMARY

In various aspects, semiconductor laser diodes and methods of making and using thereof are provided that overcome one or more of the aforementioned deficiencies. Methods of modifying the emission wavelength of a semiconductor quantum well laser diode are provided. The semiconductor quantum well laser diode can have at least one quantum well layer and at least two barrier layers. In various aspects, the methods include depositing a dielectric layer onto the semiconductor quantum well laser diode, e.g. wherein the dielectric layer has a thickness effective to induce a strain in the quantum well layer. The methods can further include annealing the quantum well laser diode at an elevated temperature with respect to room temperature for a period of time sufficient to relax at least some of the strain in the quantum well layer. In various aspects, the method results in a semiconductor quantum well laser diode that has blue-shifted emission relative to the emission of the otherwise same device except without one or both of the dielectric layer and the annealing step. In some aspects, the method results in a blue shifting of the emission of the semiconductor quantum well laser diode by about 20 meV to 350 meV. In various embodiments, the semiconductor quantum well laser diode has a final emission that is orange or yellow.

In various aspects, methods of making a semiconductor quantum well laser diode are provided by growing a semiconductor quantum well laser diode; and modifying the emission wavelength of the semiconductor quantum well laser diode according to one or more of the methods provided herein. The growing step can include any method for growing quantum well laser diodes, e.g. via molecular beam epitaxy or metal-organic chemical vapor deposition of the quantum well laser diode. Various quantum well laser diodes prepared according to these methods are also provided.

In various aspects, the semiconductor quantum well laser diode can be a group III-V semiconductor quantum well. The quantum well layer, the barrier layers, or both can include a semiconductor having the general formula $(Al_xGa_{1-x})_{1-y}In_yP$ wherein x and y are independently between 0 and 1. The quantum well layer, the barrier layers, or both can include a semiconductor having the general formula $Ga_{1-y}In_yN$, where y is between 0 and 1. In various aspects, the quantum well layer, the barrier layers, or both can include a III-V semiconductor such as AlSb, AlAs, AlN, AlP, BN, GaSb, GaAs, GaN, GaP, InSb, InAs, InN, and InP, or a group III-V ternary semiconductors alloys such as $Al_xGa_{1-x}As$.

The quantum well layer can have a thickness of about 100 Å or less. In various aspects, the quantum well layer has a thickness comparable to the de-Broglie wavelength of carriers (electrons or holes) in the semiconductor materials. One or more of the barrier layers can have a thickness of about 100 Å or less. In various aspects, one or more of the barrier layers has a thickness about the same as the thickness of the quantum well layer.

In various aspects, the semiconductor quantum well laser diode is a single quantum well structure or is a multi-quantum well structure comprising a plurality of well layers separated by a plurality of intermediate barrier layers.

The dielectric layer can generally be about any thickness effective to induce a strain in the quantum well layer. In various aspects, the dielectric layer has a thickness of at least about 500 nm. In various aspects, the dielectric layer includes silicon oxide, silicon nitride, or a combination thereof. The elevated temperature can generally be any temperature above room temperature that is sufficient to relax at least some of the strain in the quantum well layer. In various aspects, the elevated temperature is about 700° C. to 1000° C. The annealing time can generally be any time that is sufficient, at the given elevated temperature, to relax at least some of the strain in the quantum well layer. In various aspects, the time is about 10 seconds to 240 seconds. The annealing step can be repeated, e.g. for about 2-6 annealing steps.

Other systems, methods, features, and advantages of methods of modifying the emission wavelength, methods of making semiconductor quantum well laser diodes, and semiconductor laser diodes made therefrom, will be or become apparent to one with skill in the art upon examination of the following drawings and detailed description. It is intended that all such additional systems, methods, features, and advantages be included within this description, be within the scope of the present disclosure, and be protected by the accompanying claims.

BRIEF DESCRIPTION OF THE DRAWINGS

Further aspects of the present disclosure will be readily appreciated upon review of the detailed description of its various embodiments, described below, when taken in conjunction with the accompanying drawings.

DETAILED DESCRIPTION

Figure 1:
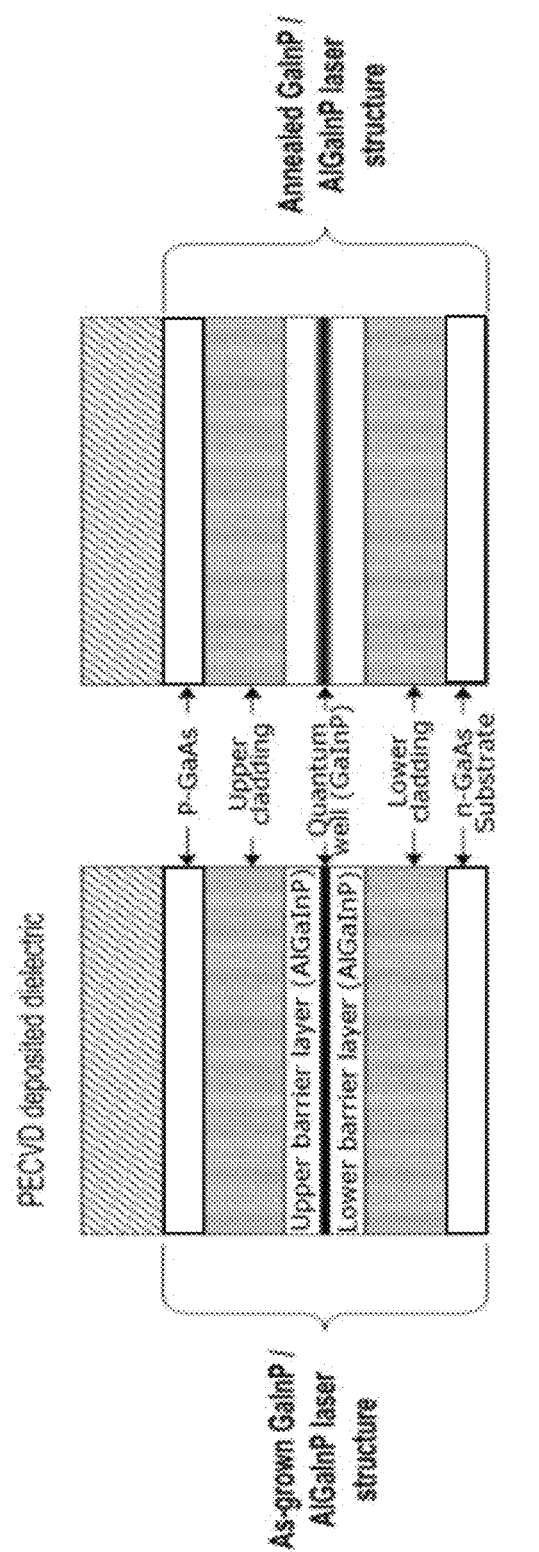
FIG. 1 depicts one example method for creating a uniform wavelength (or bandgap) shift structure in the GaInP/AlGaInP laser using the disclosed intermixing process. The as-grown GaInP/AlGaInP laser structure is first deposited with a thick layer of dielectric layer such as $SiO_2$ using plasma-enhanced chemical vapor deposition (PECVD) technique (left). The example for the GaInP/AlGaInP laser structure having, from bottom to top, an n-doped GaAs (n-GaAs) substrate, a lower cladding layer, a lower AlGaInP barrier layer, a GaInP quantum well layer, an upper AlGaInP barrier layer, an upper cladding layer, and a p-doped GaAs (p-GaAs) layer. The annealing process is performed in this structure to induce blue shift to the bandgap of the quantum well layer (right).

Methods of controlling the emission wavelength in semiconductor quantum-well laser diodes are provided. The methods can be used to blue-shift the emission wavelength of a semiconductor quantum-well laser diode, for example a Group III-V semiconductor quantum well laser diode such as an InGP quantum well laser diode. The methods can include applying a thick dielectric layer and annealing at an elevated temperature.

Semiconductor quantum-well laser diodes are provided having a blue-shifted emission wavelength. For example, semiconductor quantum well laser diodes are provided having a peak emission wavelength that is blue-shifted relative to the unmodified semiconductor quantum-well laser diode, e.g. blue shifted relative to the otherwise same quantum well laser diode without the dielectric layer or without the annealing. Methods of making semiconductor quantum-well laser diodes are also provided including controlling the emission wavelength, for example by applying a thick dielectric layer and annealing at an elevated temperature.

Before the present disclosure is described in greater detail, it is to be understood that this disclosure is not limited to particular embodiments described, and as such may, of course, vary. It is also to be understood that the terminology used herein is for the purpose of describing particular embodiments only, and is not intended to be limiting. The skilled artisan will recognize many variants and adaptations of the embodiments described herein. These variants and adaptations are intended to be included in the teachings of this disclosure and to be encompassed by the claims herein.

All publications and patents cited in this specification are herein incorporated by reference as if each individual publication or patent were specifically and individually indicated to be incorporated by reference and are incorporated herein by reference to disclose and describe the methods and/or materials in connection with which the publications are cited. The citation of any publication is for its disclosure prior to the filing date and should not be construed as an admission that the present disclosure is not entitled to antedate such publication by virtue of prior disclosure. Further, the dates of publication provided could be different from the actual publication dates that may need to be independently confirmed.

Although any methods and materials similar or equivalent to those described herein can also be used in the practice or testing of the present disclosure, the preferred methods and materials are now described. Functions or constructions well-known in the art may not be described in detail for brevity and/or clarity. Embodiments of the present disclosure will employ, unless otherwise indicated, techniques of nanotechnology, organic chemistry, material science and engineering and the like, which are within the skill of the art. Such techniques are explained fully in the literature.

It should be noted that ratios, concentrations, amounts, and other numerical data can be expressed herein in a range format. It is to be understood that such a range format is used for convenience and brevity, and thus, should be interpreted in a flexible manner to include not only the numerical values explicitly recited as the limits of the range, but also to include all the individual numerical values or sub-ranges encompassed within that range as if each numerical value and sub-range is explicitly recited. To illustrate, a numerical range of "about 0.1% to about 5%" should be interpreted to include not only the explicitly recited values of about 0.1% to about 5%, but also include individual values (e.g., 1%, 2%, 3%, and 4%) and the sub-ranges (e.g., 0.5%, 1.1%, 2.2%, 3.3%, and 4.4%) within the indicated range. Where the stated range includes one or both of the limits, ranges excluding either or both of those included limits are also included in the disclosure, e.g. the phrase "x to y", where 'x' and 'y' are numerical values, includes the range from 'x' to 'y' as well as the range greater than 'x' and less than 'y'. The range can also be expressed as an upper limit, e.g. 'about x, y, z, or less', where 'x', 'y', and 'z' are numerical values, and should be interpreted to include the specific ranges of 'about x', 'about y', and 'about z' as well as the ranges of 'less than x', less than y', and 'less than z'. Likewise, the phrase 'about x, y, z, or greater', where 'x', 'y', and 'z' are numerical values, should be interpreted to include the specific ranges of 'about x', 'about y', and 'about z' as well as the ranges of 'greater than x', greater than y', and 'greater than z'. In some embodiments, the term "about" can include traditional rounding according to significant figures of the numerical value. In addition, the phrase "about 'x' to 'y'", where 'x' and 'y' are numerical values, includes "about 'x' to about 'y'".

Definitions

Unless defined otherwise, all technical and scientific terms used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the specification and relevant art and should not be interpreted in an idealized or overly formal sense unless expressly defined herein.

The term "substrate" refers to a material having a surface capable of supporting a structure, including an electronic device or electronic device component. A structure that is "disposed" on the substrate refers to a portion of the structure in physical contact with the substrate and unable to substantially move relative to the substrate surface on which it is disposed. A structure that is disposed on a substrate may be said to be "bonded" to the substrate, although this need not necessarily be conventional chemical covalent or ionic bonding, but also non-covalent Van der Waals or hydrophobic interactions.

When referring to radiation, as used herein, the term "visible" refers to radiation having a wavelength of about 300-800 nm, about 325-750 nm, about 350-740 nm, about 370-720 nm, or about 320 nm to 700 nm; the term "ultraviolet" or "UV" refers to radiation having a wavelength of about 150-450 nm, about 170-400 nm, about 190-350 nm, or about 200-300 nm; and the term "infrared" or "IR" refers to radiation having a wavelength of about 0.7-1,000 μm, about 0.7-50 μm, about 0.74-14 μm, about 0.75-8 μm, or about 0.75-5 μm. The radiation can be described herein as "near ultraviolet" or "near UV" when the wavelength of the radiation is about 290-430 nm, about 300-400 nm, about 310-395 nm, or about 320-380 nm. The radiation can be described herein as "deep ultraviolet" or "deep UV" when the wavelength of the radiation is about 150-320 nm, about 185-310 nm, or about 200-300 nm. The radiation can be described as "near infrared" or "near IR" when the wavelength of the radiation is about 680 nm to 2000 nm, about 680 nm to 1000 nm, about 680 nm to 820 nm, about 700 nm to 800 nm, or about 720 nm to 800 nm. The radiation can be described herein as "violet" if it has a wavelength of about 300-450 nm, about 325-440 nm, about 350-430 nm, or about 360-420 nm; as "indigo" if it has a wavelength of about 400-480 nm, about 420-460 nm, about 430-450 nm, or about 440 nm; as "blue" if it has a wavelength of about 430-520 nm, about 440-510 nm, about 450-500 nm, or about 460-490 nm; as "cyan" if it has a wavelength of about 480-540 nm, about 490-530 nm, about 500-520 nm, or about 501 nm; as "green" if it has a wavelength of about 500-600 nm, about 510-580 nm, about 520-565 nm, or about 540-550 nm; as "yellow" if it has a wavelength of about 540-610 nm, about 550-600 nm, about 560-600 nm, about 564-590 nm, or about 589 nm; as "orange" if it has a wavelength of about 570-650 nm, about 580-640 nm, about 590-625 nm, about 590-620 nm, or about 593 nm; and as "red" if it has a wavelength of about 600-800 nm, about 610-780 nm, about 625-740 nm, or about 650-720 nm. The radiation can be described herein as "near infrared" or "NIR" if it has a wavelength of about 700-3,000 nm, about 700 to 2000 nm, about 740-1,400 nm, or about 750-1,000 nm; as "short-wave infrared" or "SWIR" if it has a wavelength of about 850-2,000 nm, about 900-1, 700 nm, or about 1,000-1,400 nm; as "medium-wave infrared" or "MWIR" if it has a wavelength of about 2-8 μm, about 3-5 μm, or about 3.5-4.5 μm; and as "long-wave infrared" or "LWIR" if it has a wavelength of about 7-14 μm, about 8-12 μm, or about 9-10 μm.

The term "semiconductor" refers to any material that is an insulator at a low temperature, but which has an appreciable electrical conductivity at temperatures of about 300 Kelvin. Use of the term semiconductor is consistent with this term in the art of microelectronics and electronic devices. In some embodiment the semiconductor is an inorganic semiconductor. Useful inorganic semiconductors include those comprising element semiconductors, such as silicon, germanium and diamond, and compound semiconductors, such as group IV compound semiconductors such as SiC and SiGe, group III-V semiconductors such as AlSb, AlAs, AlN, AlP, BN, GaSb, GaAs, GaN, GaP, InSb, InAs, InN, and InP, group III-V ternary semiconductors alloys such as $Al_xGa_{1-x}As$, group II-VI semiconductors such as CsSe, CdS, CdTe, ZnO, ZnSe, ZnS, and ZnTe, group I-VII semiconductors CuCl, group IV-VI semiconductors such as PbS, PbTe and SnS, layer semiconductors such as $PbI_2$, $MoS_2$ and GaSe, oxide semiconductors such as CuO and $Cu_2O$. The term semiconductor includes intrinsic semiconductors and extrinsic semiconductors doped with one or more selected materials, including semiconductor having p-type doping materials and n-type doping materials, to provide beneficial electronic properties useful for a given application or device. The term semiconductor includes composite materials comprising a mixture of semiconductors and/or dopants. Specific semiconductor materials useful for in some embodiments include, but are not limited to, Si, Ge, SiC, AlP, AlAs, AlSb, GaN, GaP, GaAs, GaSb, InP, InAs, GaSb, InP, InAs, InSb, ZnO, ZnSe, ZnTe, CdS, CdSe, ZnSe, ZnTe, CdS, CdSe, CdTe, HgS, PbS, PbSe, PbTe, AlGaAs, AlInAs, AlInP, GaAsP, GaInAs, GaInP, AlGaAsSb, AlGaInP, and GaInAsP. Porous silicon semiconductor materials are useful for applications of aspects described herein in the field of sensors and light emitting materials, such as light emitting diodes (LEDs) and solid state lasers.

Methods of Controlling or Modifying the Emission Wavelength In Semiconductor Lasers Methods of controlling the emission wavelength in semiconductor lasers are provided. The lasers can be quantum-well diode lasers, including single quantum well (SQW) and multi-quantum well (MQW) semiconductor structures. The term "quantum-well", as used herein, refers to a particular kind of multilayer heterostructure in which a thin 'well' layer is sandwiched by two 'barrier' layers such that both electrons and holes experience a lower energy in the well layer as compared to the barrier layers and the well layer is thin enough that the electrons and holes are effectively confined to two dimensions, e.g. the well layer has a typical thickness of about 120 Å, 110 Å, 100 Å, 90 Å, 80 Å, or less; or have a thickness that is comparable to the de-Broglie wavelength of the carriers (i.e., electrons or holes) that support the quantum confinement effects (e.g. within about 30%, 25%, 20%, 15%, or 10% of the de-Broglie wavelength of the carriers in the semiconductor).

The electronic states in a quantum well can correspond to the standing waves in the direction perpendicular to the layers. The quantum well semiconductor structure can be a single quantum well (SQW) semiconductor structure, meaning there is one well layer sandwiched by an upper barrier layer (i.e., quantum barrier and a lower barrier layer. The quantum well semiconductor structure can be a multi-quantum well (MQW) semiconductor structure, meaning there are at least two well layers sandwiched between an upper barrier layer and lower barrier layer and separated by intermediate barrier layers, optionally including intermediate cladding layers. The MQW semiconductor structure can have 2, 3, 4, 5, 6, or more well layers. The well layers in a MQW semiconductor structure can be separated, for instance, by about 50 Å, 75 Å, 100 Å, 150 Å, 200 Å, or more. The well layers in a MQW semiconductor structure can be separated such that there is not significant penetration of the wavefunction between the individual well layers.

The semiconductor quantum well laser diode can be a group III-V semiconductor quantum well. A variety of group III-V semiconductor quantum wells are known. The semiconductor quantum well laser diode can be GaAs/GaAlAs on GaAs, GaSb/GaAlSb on GaSb or GaAs, InGaAs/InAlAs on InP, InAs/GaSb, or InGaAs/GaAs. The well layer, the barrier layers, or both can have a semiconductor such as those described herein. The semiconductor can have the general formula $(Al_xGa_{1-x})_{1-y}In_yP$ wherein x and y are independently between 0 and 1, e.g. wherein x is about 0.2 to 0.9, 0.4 to 0.9, 0.4 to 0.7, or 0.5 to 0.7 and y is about 0.2 to 0.8, 0.3 to 0.7, 0.4 to 0.6, or 0.45 to 0.55. The semiconductor can have the general formula $Ga_{1-y}In_yN$, where y is between 0 and 1, e.g. wherein y is about 0.2 to 0.8, 0.3 to 0.7, 0.4 to 0.6, or 0.45 to 0.55.

The quantum well laser diode can have a variety of structures that will be apparent to the skilled artisan upon reading the present disclosure. In some embodiments the semiconductor quantum well laser diode is a single quantum well structure having a well layer sandwiched between an upper barrier layer and a lower barrier layer. The single quantum well structure can also have an upper and/or lower cladding layer. The single quantum well structure can have a bottom contact electrode and/or a top contact electrode. The semiconductor quantum well laser diode can be a multi-quantum well structure comprising a plurality of well layers separated by a plurality of intermediate barrier layers. For example, the multi-quantum well structure can have 2, 3, 4, 5, 6, or more well layers each separated by intermediate barrier layers. The quantum well layer(s) can have a thickness of about 120 Å, 110 Å, 100 Å, 90 Å, 80 Å, or less. The barrier layers can have a thickness of about 120 Å, 110 Å, 100 Å, 90 Å, 80 Å, or less.

The methods can include depositing a dielectric layer onto the semiconductor quantum well laser diode, wherein the dielectric layer has a thickness effective to induce a strain in the quantum well layer. The dielectric layer can be deposited directly into the top of the semiconductor quantum well laser diode, e.g. on top of the barrier lay, on top of the upper cladding layer, or on top of a top contact electrode. The dielectric layer can be silicon oxide, silicon nitride, aluminum oxide, hafnium oxide, or a combination thereof. The dielectric layer can be deposited with any thickness sufficient to induce the strain in the quantum well layer. In some embodiments the strain induced by the dielectric layer is about 30%-80%, about 40%-70%, about 45%-70%, about 50%-65%, or about 60% compressive relative to the quantum well.

Figure 2:
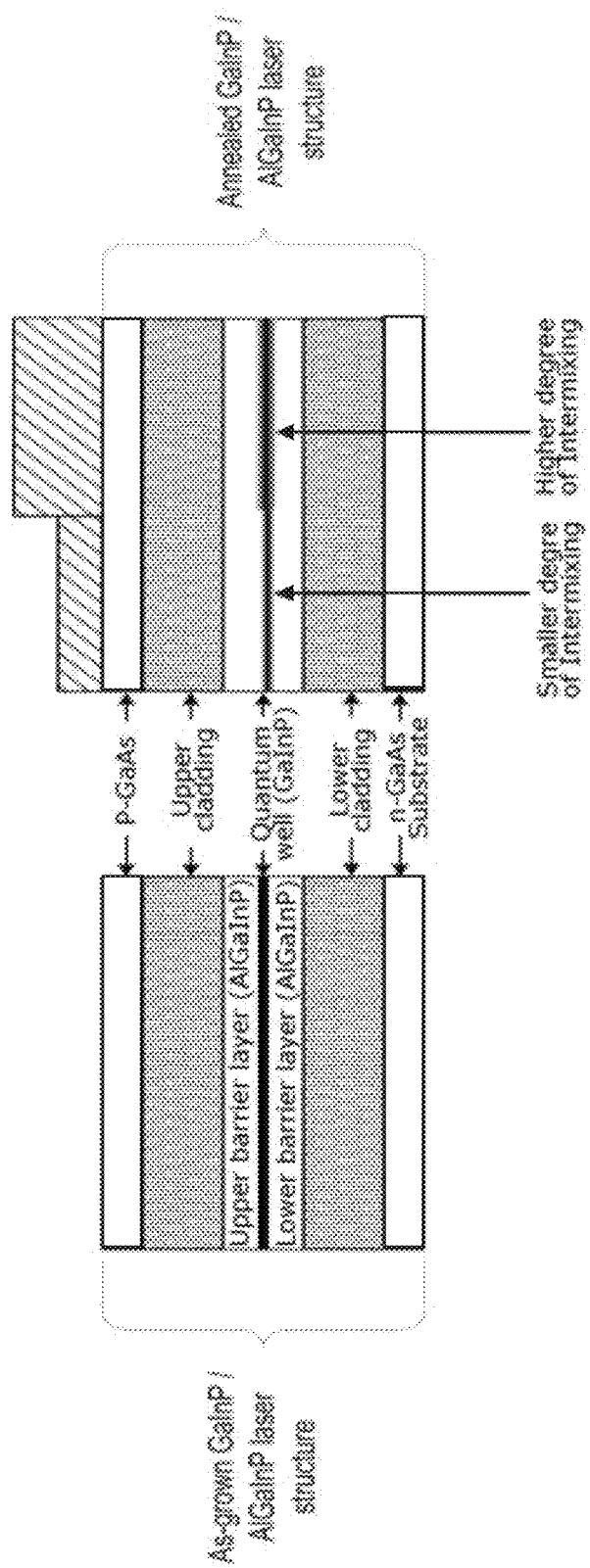
FIG. 2 depicts one example method for creating two bandgaps chip in the GaInP/AlGaInP laser structure. In this case, the as-gown laser structure (left) is deposited with dielectric caps such as $SiO_2$ layers using PECVD and then dielectric layer is etched to two regions having different thicknesses (right). For intermixing, the sample (right) is annealed in rapid thermal processing to promote intermixing of the quantum well. Sections covered with thinner dielectric layer will induce a smaller degree of bandgap shift, while section covered with thicker dielectric layer will produce a larger degree of bandgap blue shift.
Figure 3:
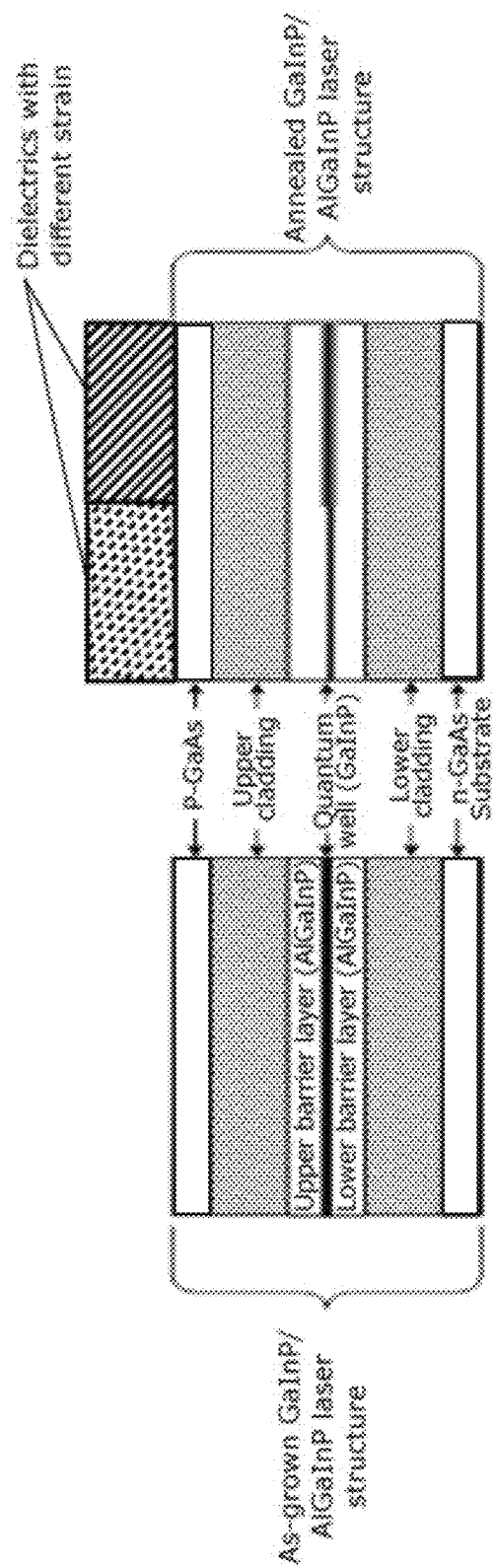
FIG. 3 depicts another example method for creating two bandgaps chip in the GaInP/AlGaInP laser structure. In this case, the as-gown laser structure (left) is deposited with two different types of dielectric cap materials having two different strains to induce a smaller degree of mixing (less strain) and a higher degree of mixing (more strain). The laser structures have, from bottom to top, an n-doped GaAs (n-GaAs) substrate, a lower cladding layer, a lower AlGaInP barrier layer, a GaInP quantum well layer, an upper AlGaInP barrier layer, an upper cladding layer, a p-doped GaAs (p-GaAs) layer, and a thick dielectric layer having two different dielectric materials with different strain.
Figure 4:
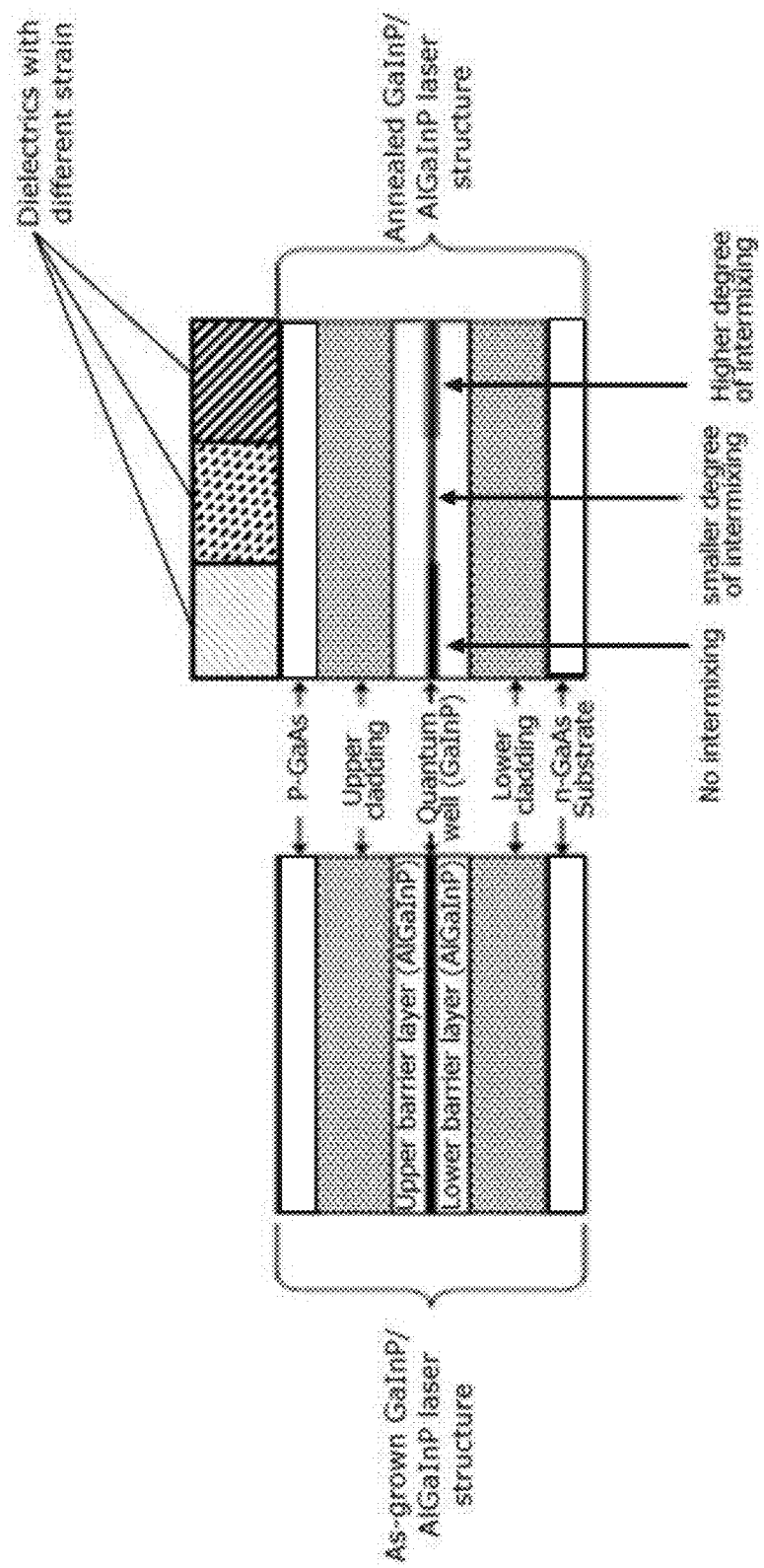
FIG. 4 depicts one example method for creating three-bandgap chip in the GaInP/AlGaInP laser structure. In this case, the as-grown laser structure (left) is deposited with dielectric layers with three different strains (right) to induce no intermixing (least amount of strain), a small degree of mixing (intermediate strain), and a higher degree of mixing (highest amount of strain). The laser structures have, from bottom to top, an n-doped GaAs (n-GaAs) substrate, a lower cladding layer, a lower AlGaInP barrier layer, a GaInP quantum well layer, an upper AlGaInP barrier layer, an upper cladding layer, a p-doped GaAs (p-GaAs) layer, and a thick dielectric layer having three different dielectric materials with different strain.

The methods can include depositing more than one dielectric layer (see FIGS. 2-4) to induce different amounts of strain at different locations in the quantum well layer. The methods can also include etching a deposited dielectric layer to create different amounts .of strain at different locations in the quantum well layer. The dielectric layer can include a single thick layer of dielectric such as $SiO_2$ (see FIG. 1). The dielectric layer can be etched to have two regions having different thicknesses (see FIG. 2) or can be deposited with two different dielectric materials (see FIG. 3). The methods can include depositing dielectric layers with three different strains, e.g. to induce no intermixing (least amount of strain), a small degree of mixing (intermediate strain), and a higher degree of mixing (see FIG. 4).

The methods can include annealing the quantum well laser diode with the thick layer of dielectric cap at an elevated temperature with respect to room temperature for a period of time sufficient to relax at least some of the strain in the quantum well layer. The elevated temperature can be about 600° C. to 1100° C., 650° C. to 1050° C., 700° C. to 1000° C., 725° C. to 975° C., 750° C. to 950° C., or about 800° C. to 950° C. The annealing can be performed for a period of time including about 10 seconds to 1,000 seconds, about 10 seconds to 500 seconds, about 10 seconds to 300 seconds, about 20 seconds to 300 seconds, about 20 seconds to 240 seconds, about 30 seconds to 240 seconds, or about 10 seconds to 240 seconds. The annealing can be repeated as many times as necessary to achieve the required modification of the emission wavelength. In some embodiments the annealing step is repeated for about 2-20, 2-12, 2-10, 2-6, or 2-5 annealing cycles.

The methods can result in blue-shifting the emission of the semiconductor quantum well laser diode, e.g. wherein the method results in a semiconductor quantum well laser diode that has blue-shifted emission relative to the emission of the otherwise same device except without one or both of the dielectric layer and the annealing step. The methods can result in a blue shifting of the emission of the semiconductor quantum well laser diode by about 10 meV to 350 meV, 20 meV to 350 meV, 30 meV to 350 meV, 30 meV to 320 meV, 30 meV to 300 meV, or about 50 meV to 250 meV. The semiconductor quantum well laser diode can be blue shifted to have an emission that is orange or yellow.

Methods of making semiconductor quantum well laser diodes are provided. The methods can include growing a semiconductor quantum well laser diode; and modifying the emission wavelength of the semiconductor quantum well laser diode according to the method described herein. Many methods of growing semiconductor quantum wells are known in the art. The methods can include molecular beam epitaxy or metal-organic chemical vapor deposition to form the quantum well laser diode. Quantum well laser diodes made according to these methods are also provided.

EXAMPLES

Now having described various embodiments of the present disclosure, in general, the following Examples describe some additional embodiments of the present disclosure. While embodiments of the present disclosure are described in connection with the following examples and the corresponding text and figures, there is no intent to limit embodiments of the present disclosure to this description. On the contrary, the intent is to cover all alternatives, modifications, and equivalents included within the spirit and scope of embodiments of the present disclosure.

Figure 5:
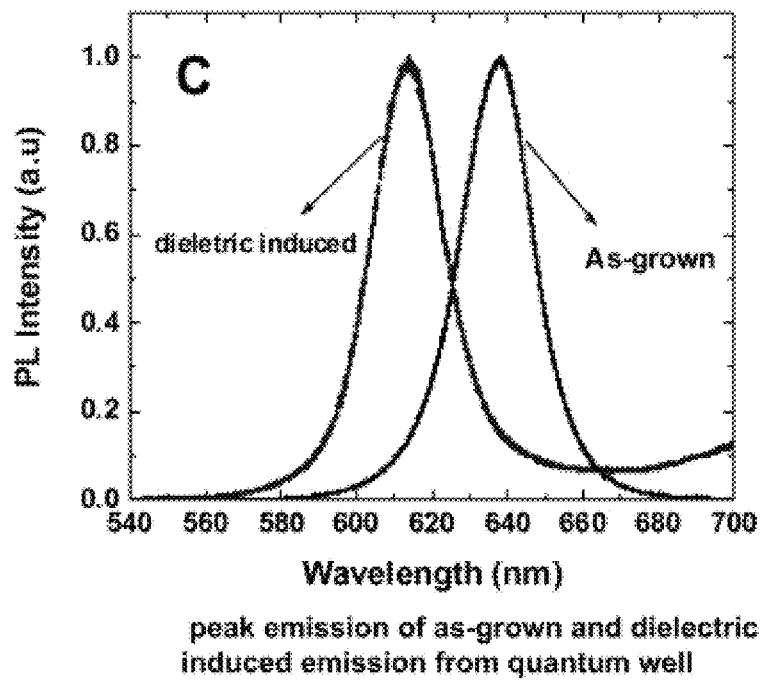
FIG. 5 is a graph of the photoluminescence intensity (a.u.) as a function of wavelength (nm) demonstrating the photoluminescence spectra of as as-grown (black curve, longer wavelength) and a dielectric-induced strain (blue curve, shorter wavelength) for a GaInP/AlGaInP laser structure having a single InGaP quantum well sandwiched between two AlGaInP barrier layers and surrounded by outer cladding layers.

FIG. 1 shows a laser structure with a single InGaP (($Ga_{0.53}In_{0.47}P$)) quantum well (QW) sandwiched between two barrier layers (optical waveguide layer) of AlGaInP ($Al_{0.3}Ga_{0.2}In_{0.5}P$) and surrounded by outer cladding layers each about 1.2 μm thick. The overall device structure is lattice-matched to the GaAs substrate; the composition of thin GaInP ($Ga_{0.53}In_{0.47}P$) quantum well was chosen to accommodate a limited amount of strain (tensile in our case). A thick dielectric comparable to the thickness of the upper cladding was deposited on the surface of the laser structure and annealed inside rapid thermal process system at a temperature higher than the growth temperature. Application of thick dielectric encapsulation and annealing at elevated temperature enhance the interdiffusion rate of the atomic elements, hence changing the atomic composition, between InGaP quantum-well and AlGaInP quantum barriers, (see FIG. 1), resulting in blue emission wavelength shift (see FIG. 5).

The introduction of strain in quantum well of the laser structure splits the degeneracy at the valence band maximum, and separates the heavy-hole (HH) and light-hole (LH) subbands. For tensile strain (in our case), transitions involving the light-holes have the lowest energy. By introduction of the thick dielectric encapsulation and annealing at higher annealing temperature (creates compressive strain) the existed strain in the exemplary structure is manipulated and hence the splitting of the valence band. In strained layers, the change in the band structure leads to a reduction of the density of states at the edge of the valence band and also the effective mass of electrons and holes, hence reduced threshold current is expected as compared to unstrained lasers.

Figure 6:
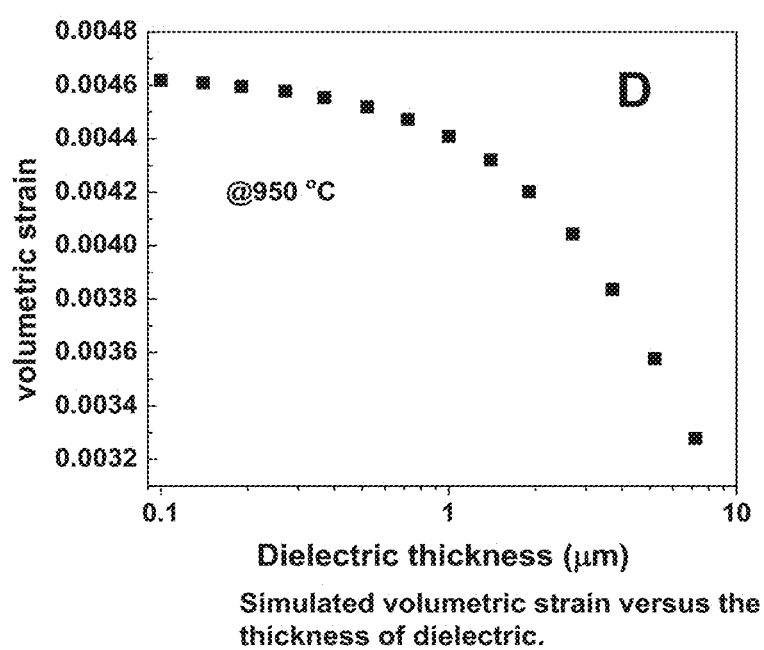
FIG. 6 is a graph of the volumetric strain at 950° C. as a function of the thickness of the dielectric layer (μm) for the dielectric-induced strain in a GaInP/AlGaInP laser structure having a single InGaP quantum well sandwiched between two AlGaInP barrier layers and surrounded by outer cladding layers.
Figure 7:
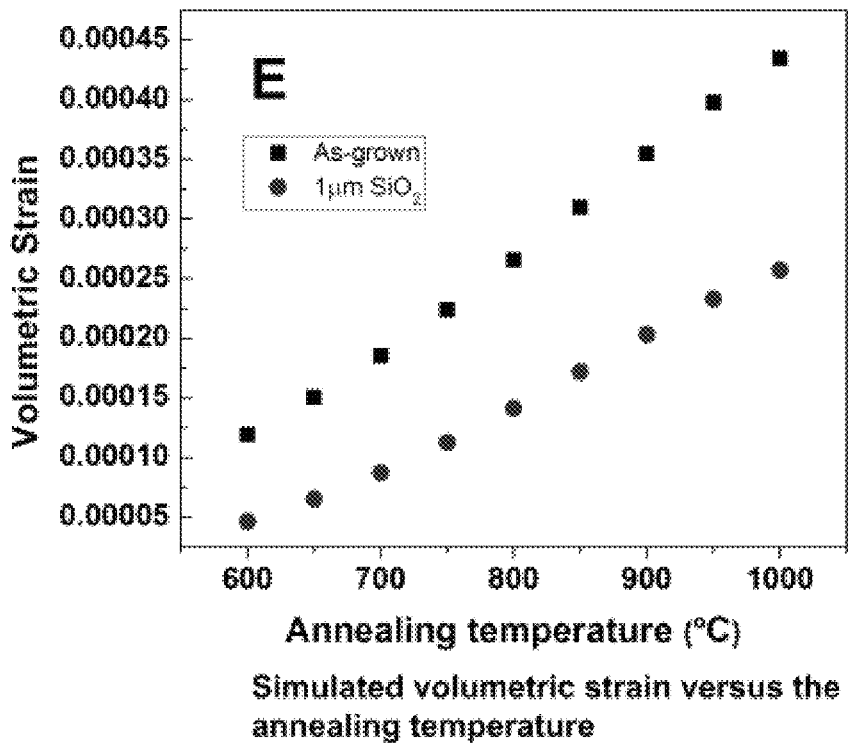
FIG. 7 is a graph of the volumetric strain as a function of the annealing temperature (° C.) in an as-grown (black squares) and a dielectric-induced strain (red circles) GaInP/AlGaInP laser structure having a single InGaP quantum well sandwiched between two AlGaInP barrier layers and surrounded by outer cladding layers. The dielectric layer is a 1 μm thick $SiO_2$ layer.

The Comsole simulation (see FIG. 6 and FIG. 7) which was done at various dielectric thickness and annealing temperatures confirms reduction of tensile strain in the quantum well. The experimental and simulated minimum critical thickness for inducing any meaningful blue emission is found to be 500 nm which preserves the surface morphology, photoluminescence (PL) characteristics and electrical properties of the laser structures.

Figure 8:
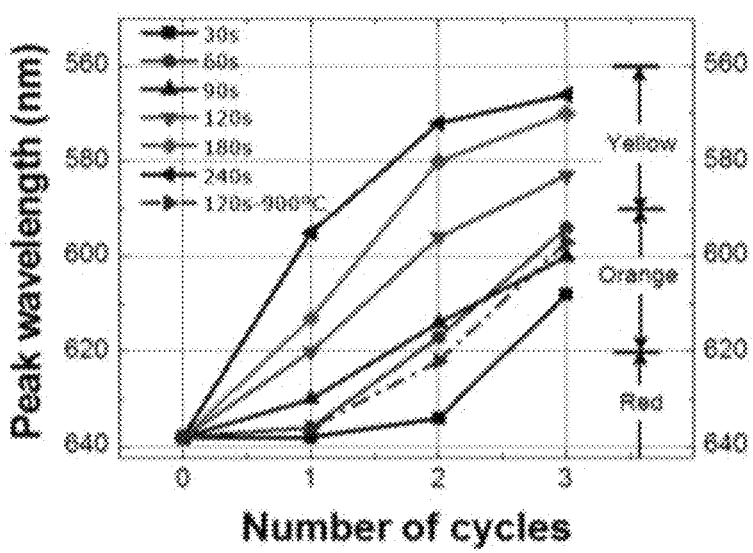
FIG. 8 is a graph of the room temperature peak photoluminescence wavelength (nm) as a function of the number of annealing cycles for GaInP/AlGaInP laser structure having a thick SiO2 dielectric layer and annealed at 950° C. for 30 seconds, 60 seconds, 90 seconds, 120 seconds, 180 seconds, 240 seconds per cycle (or 120 seconds at 900° C.) per annealing cycle.
Figure 9:
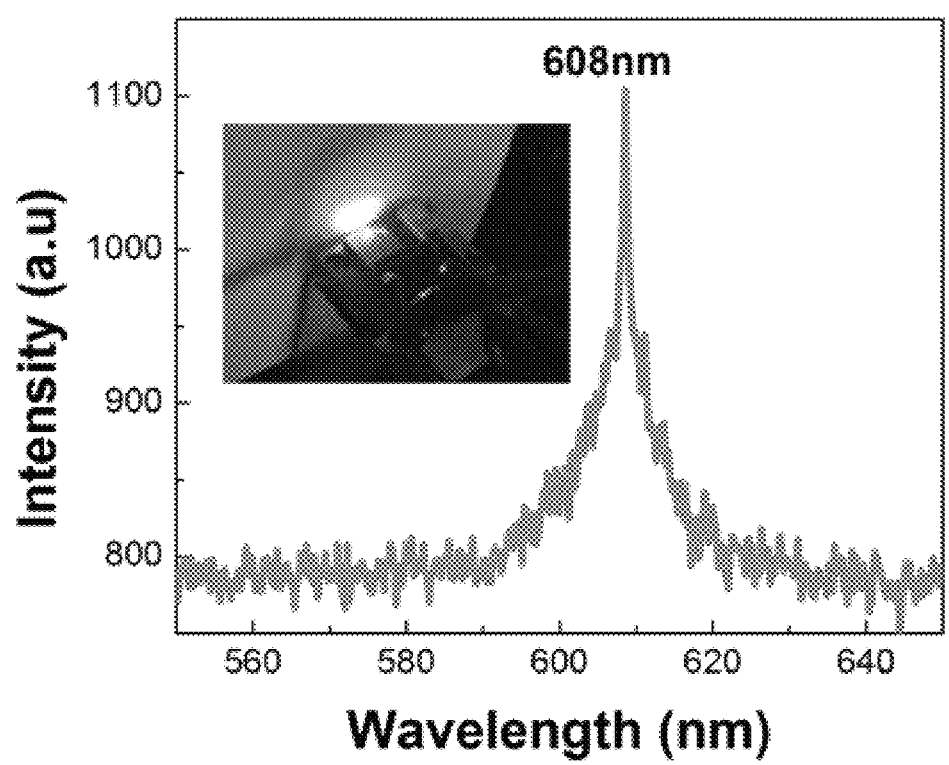
FIG. 9 is a graph of the photoluminescence intensity (a.u.) as a function of wavelength (nm) demonstrating the orange (608 nm) GaInP/AlGaInP laser created by dielectric-induced strain. The laser is depicted in the inset.

FIG. 8 is a graph of the peak emission wavelength of the single InGaP (($Ga_{0.53}In_{0.47}P$)) quantum well with various annealing times and cycles. A significant blue-shift of ~75 nm (250 meV) was measured after cyclic annealing while maintaining good crystal quality, allowing the realization of orange and yellow photoluminescence emission. FIG. 9 is a graph of the emission from the single InGaP (($Ga_{0.53}In_{0.47}P$)) quantum well demonstrating orange emission at room temperature by using the dielectric induced post-growth bandgap enginnering process. The single InGaP (($Ga_{0.53}In_{0.47}P$)) quantum well demonstrated emission with a peak intensity at 608 nm.

It should be emphasized that the above-described embodiments of the present disclosure are merely possible examples of implementations, and are set forth only for a clear understanding of the principles of the disclosure. Many variations and modifications may be made to the above-described embodiments of the disclosure without departing substantially from the spirit and principles of the disclosure. All such modifications and variations are intended to be included herein within the scope of this disclosure.

We claim:

1. A method of modifying the emission wavelength of a semiconductor quantum well laser diode having at least one quantum well layer and at least two barrier layers, the method comprising the steps of:
    (i) depositing a dielectric layer onto the semiconductor quantum well laser diode, wherein the dielectric layer has a thickness effective to induce a strain in the quantum well layer;
    (ii) annealing the quantum well laser diode at an elevated temperature with respect to room temperature for a period of time sufficient to relax at least some of the strain in the quantum well layer, thereby modifying the emission wavelength of the semiconductor quantum well laser diode.

2. The method of claim 1, wherein the semiconductor quantum well laser diode is a group III-V semiconductor quantum well.

3. The method of claim 1, wherein the quantum well layer, the barrier layers, or both comprise a semiconductor having the general formula $(Al_xGa_{1-x})_{1-y}In_yP$ wherein x and y are independently between 0 and 1.

4. The method of claim 1, wherein the quantum well layer, the barrier layers, or both comprise a semiconductor having the general formula $Ga_{1-y}In_yN$, where y is between 0 and 1.

5. The method of claim 1, wherein the quantum well layer, the barrier layers, or both comprise a III-V semiconductor selected from the group consisting of AlSb, AlAs, Aln, Al P, BN, GaSb, GaAs, GaN, GaP, InSb, InAs, InN, and InP, and group III-V ternary semiconductors alloys such as $Al_xGa_{1-x}As$.

6. The method of claim 1, wherein the quantum well layer has a thickness of about 100 Å or less, or has a thickness within about 30% of the de-Broglie wavelength of carriers (electrons or holes) that support quantum confinement effects in the semiconductor quantum well laser diode.

7. The method of claim 1, wherein the semiconductor quantum well laser diode is a single quantum well structure.

8. The method of claim 1, wherein the semiconductor quantum well laser diode is a multi-quantum well structure comprising a plurality of well layers separated by a plurality of intermediate barrier layers.

9. The method of claim 1, wherein the barrier layers have a thickness of about 100 Å or less, or have a thickness about the same as the thickness of the at least one quantum well layer.

10. The method of claim 1, wherein the dielectric layer has a thickness of at least about 500 nm.

11. The method of claim 1, wherein the elevated temperature is about 700° C. to 1000° C.

12. The method of any claim 1, wherein the period of time is about 10 seconds to 240 seconds.

13. The method of claim 1, wherein the annealing step is repeated for about 2-6 annealing cycles.

14. The method of claim 1, wherein the dielectric layer comprises silicon oxide, silicon nitride, aluminum oxide, hafnium oxide, or a combination thereof.

15. The method of claim 1, wherein the method results in a semiconductor quantum well laser diode that has blue-shifted emission relative to the emission of the otherwise same device except without one or both of the dielectric layer and the annealing step.

16. The method of claim 1, wherein the method results in a blue-shifting of the emission of the semiconductor quantum well laser diode by about 20 meV to 350 meV.

17. The method of claim 1, wherein the semiconductor quantum well laser diode has an emission that is orange or yellow.

18. A method of making a semiconductor quantum well laser diode comprising
    (i) growing a semiconductor quantum well laser diode; and
    (ii) modifying the emission wavelength of the semiconductor quantum well laser diode according to the method of claim 1.

19. The method of claim 18, wherein the growing step comprises molecular beam epitaxy or metal-organic chemical vapor deposition of the quantum well laser diode.

20. A quantum well laser diode made according to the method of claim 1.

* * * * *